(12) United States Patent
Kim

(10) Patent No.: US 7,947,587 B2
(45) Date of Patent: May 24, 2011

(54) HIGH VOLTAGE SEMICONDUCTOR DEVICE AND METHOD FOR MANUFACTURING THE SAME

(75) Inventor: Jeong-Ho Kim, Dongdaemun-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 294 days.

(21) Appl. No.: 12/247,532

(22) Filed: Oct. 8, 2008

(65) Prior Publication Data

US 2009/0114990 A1 May 7, 2009

(30) Foreign Application Priority Data

Nov. 6, 2007 (KR) .................. 10-2007-0112588

(51) Int. Cl.
*H01L 21/00* (2006.01)
(52) U.S. Cl. .................. 438/585; 438/591; 257/215
(58) Field of Classification Search .................. 257/215; 438/585, 591
See application file for complete search history.

(56) References Cited

U.S. PATENT DOCUMENTS

| | | | | |
|---|---|---|---|---|
| 6,159,872 A * | 12/2000 | Essaian et al. | ................ | 438/787 |
| 6,177,362 B1 * | 1/2001 | Huang et al. | ................ | 438/787 |
| 6,346,442 B1 * | 2/2002 | Aloni et al. | ................ | 438/258 |
| 6,501,139 B1 * | 12/2002 | Petti | ................ | 257/408 |
| 6,784,115 B1 * | 8/2004 | Ni et al. | ................ | 438/770 |
| 6,972,229 B2 * | 12/2005 | Choi | ................ | 438/257 |
| 7,390,718 B2 * | 6/2008 | Roizin et al. | ................ | 438/275 |
| 7,411,242 B2 * | 8/2008 | Kobayashi et al. | ................ | 257/314 |

FOREIGN PATENT DOCUMENTS

| JP | 2005-101597 | 4/2005 |
|---|---|---|
| KR | 10-2006-0077221 | 7/2006 |

\* cited by examiner

*Primary Examiner* — Jarrett J Stark
*Assistant Examiner* — Nicholas Tobergte
(74) *Attorney, Agent, or Firm* — Sherr & Vaughn, PLLC

(57) ABSTRACT

A semiconductor device, particularly, a method for manufacturing a high voltage semiconductor device is disclosed. The method includes forming a high voltage gate oxide film on a semiconductor substrate having a high voltage device region and a low voltage device region, forming a gate electrode on the semiconductor substrate having the high voltage gate oxide film, forming a fluorinated silicate glass (FSG) film and a liner film sequentially on an entire surface of the semiconductor substrate including the gate electrode, and forming an interlayer insulating film on the liner film. Thus, it is possible to prevent an increase in leakage current of the high voltage semiconductor device such as a MOS transistor.

11 Claims, 3 Drawing Sheets

HIGH VOLTAGE SEMICONDUCTOR DEVICE AND METHOD FOR MANUFACTURING THE SAME

The present application claims priority under 35 U.S.C. §119 to Korean Patent Application No. 10-2007-0112588 (filed on Nov. 6, 2007), which is hereby incorporated by reference in its entirety.

BACKGROUND

Generally, a high voltage semiconductor device may be utilized when high voltage or high current output is required to drive a motor or when a high voltage is input from an external source. Typically, the high voltage semiconductor device includes a high voltage driving region and a low voltage driving region in a system-on-chip structure. In the high voltage device, when a low voltage is applied to a gate electrode and a high voltage is applied only to a drain electrode, the low voltage driving region and the high voltage driving region are formed at the same time. A through gate-oxide implantation (TGI) process is performed during a manufacturing process of a high voltage semiconductor device to form the low voltage driving region and the high voltage driving region on and/or over the chip while maintaining the existing characteristics. In the TGI process, an ion implantation process is performed to form a well region on and/or over a semiconductor substrate on and/or over which a high voltage gate oxide film is deposited.

Figure 1:
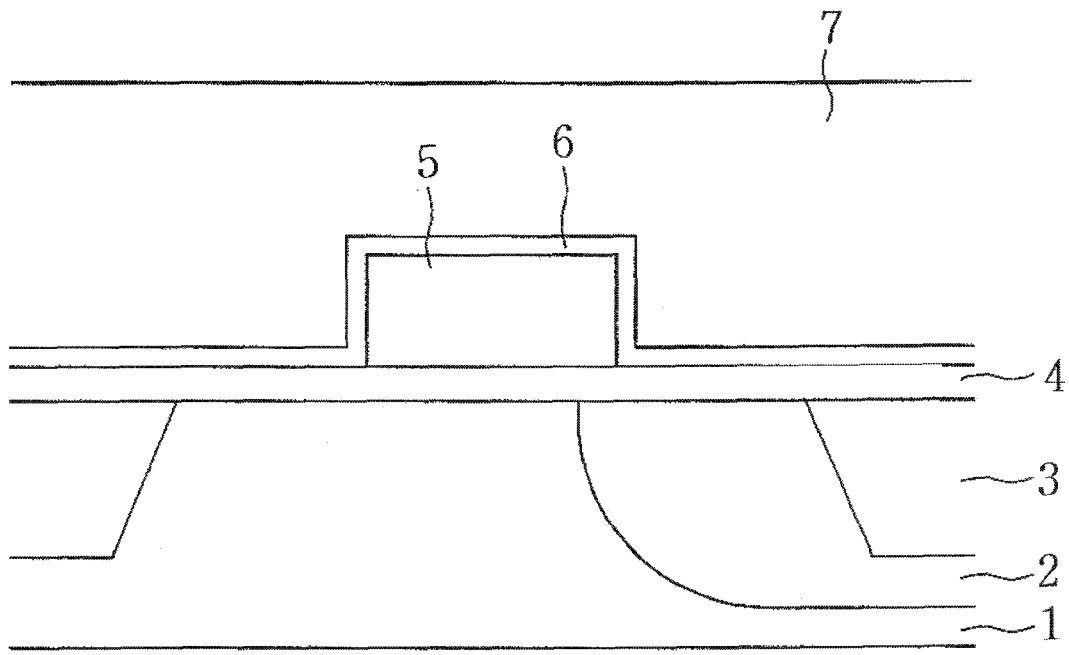

As illustrated in example FIG. 1, a high voltage semiconductor device includes semiconductor substrate 1 having a high voltage device region and a low voltage device region, well region 2, device isolation film 3, gate oxide film 4, gate electrode 5, liner film 6 and interlayer insulating film 7. Device isolation film 3 is formed to define a device isolation region on and/or over semiconductor substrate 1 having the high voltage device region and the low voltage device region. Gate oxide film 4 is formed on and/or over semiconductor substrate 1 in the high voltage device region. After high voltage gate oxide film 4 is formed, a photoresist pattern is formed at a portion of the entire surface of substrate 1. Then, an ion implantation process is performed on semiconductor substrate 1 using the photoresist pattern as a mask to form well region 2 therein. In the ion implantation process for forming well region 2, ions are also implanted into the exposed high voltage gate oxide film 4. Accordingly, a trap site may be formed in gate oxide film 4 into which the ions are implanted. The photoresist pattern is then removed.

Gate electrode 5 is formed on and/or over semiconductor substrate 1 having well region 2. Gate electrode 5 is formed in an active region of substrate 1. Liner film 6 is formed on and/or over the entire surface of semiconductor substrate 1 including gate electrode 5 by forming a tetra ethyl ortho silicate (TEOS) film using preferential metal deposition (PMD). Interlayer insulating film 7 is formed on and/or over the entire surface of the resultant structure including liner film 6. Materials such as hydrogen and boron included in interlayer insulating film 7 may move to the trap site in gate oxide film 4. Consequently, leakage current increases in a threshold voltage region of the high voltage semiconductor device, thereby causing problems of increasing power consumption and reducing the device characteristics. Further, when the TEOS film is used as liner film 6, leakage current of the semiconductor device may increase significantly according to the state and atmosphere of a chamber in which liner film 6 is deposited. Particularly, $C_3F_8$ gas is used in cleaning the chamber in which the TEOS film of liner film 6 is deposited. If fluorine included in the $C_3F_8$ gas has a high density, a low level of leakage current of the NMOS transistor is measured. On the other hand, if fluorine included in the $C_3F_8$ gas has a low density, a high level of leakage current of the NMOS transistor is measured. Meaning, there is a problem that the leakage current of the semiconductor device largely increases according to the fluorine atmosphere in the chamber in which the TEOS film is deposited.

SUMMARY

Embodiments relate to a method for manufacturing a high voltage semiconductor device that prevents an increase in leakage current of a high voltage semiconductor device such as a MOS transistor to maximize the device characteristics.

Embodiments relate to a method for manufacturing a high voltage semiconductor device that may include at least one of the following: forming a high voltage gate oxide film on and/or over a semiconductor substrate having a high voltage device region and a low voltage device region; and then forming a well region in the semiconductor substrate having the high voltage gate oxide film; and then forming a gate electrode on and/or over the semiconductor substrate having the high voltage gate oxide film; and then forming a fluorinated silicate glass (FSG) film and a liner film sequentially on and/or over an entire surface of the semiconductor substrate including the gate electrode; and then performing an annealing process on the entire surface of the semiconductor substrate having the liner film to form an annealed liner film; and then forming an interlayer insulating film on and/or over the liner film.

Embodiments relate to a method for manufacturing a high voltage semiconductor device that may include at least one of the following: forming a gate oxide film over a semiconductor substrate in a high voltage device region thereof; and then forming a gate electrode over the semiconductor substrate including the gate oxide film; and then sequentially forming a fluorinated silicate glass (FSG) film and a liner film over the semiconductor substrate including the gate electrode; and then forming an interlayer insulating film over one of the FSG film and the liner film.

Embodiments relate to a high voltage semiconductor device that may include at least one of the following: a device isolation film formed in a semiconductor substrate having a high voltage device region and a low voltage device region; a first oxide film formed over the semiconductor substrate in the high voltage device region, wherein at least a portion of the first oxide film includes a trap region; and then a well region formed in the semiconductor substrate; a gate electrode formed over the first oxide film; a second oxide film formed over the gate electrode; a first dielectric film formed in the upper surface of the second oxide film; and a second dielectric film formed over the first dielectric film.

Embodiments relate to a method for manufacturing a high voltage semiconductor device that may include at least one of the following: forming a device isolation film for defining a device isolation region in a semiconductor substrate having a high voltage device region and a low voltage device region; and then forming a first oxide film over the semiconductor substrate in the high voltage device region; and then simultaneously forming a well region in the semiconductor substrate and a trap region in the first oxide film; and then forming a gate electrode over the first oxide film; and then forming a second oxide film over the gate electrode; and then forming a first dielectric film in the second oxide film; and then forming a second dielectric film over the first dielectric film.

In accordance with embodiments, the liner film is formed as any one of a preferential metal deposition (PMD) film, a middle temperature oxide (MTO) film and a high temperature oxide (HTO) film. In accordance with embodiments, the interlayer insulating film is formed as any one of a borophosphosilicate glass (BPSG) film, a phosphosilicate (PSG) film and an undoped silicate glass (USG) film. In accordance with embodiments, forming an FSG film and a liner film sequentially includes depositing the FSG film on and/or over the entire surface of the semiconductor substrate including the gate electrode, and then depositing a liner oxide film on and/or over the FSG film. In accordance with embodiments, forming an FSG film and a liner film sequentially includes depositing a liner oxide film on and/or over the entire surface of the semiconductor substrate including the gate electrode, and then forming the FSG film in the liner oxide film by performing ion implantation on and/or over the entire surface of the semiconductor substrate. In accordance with embodiments, before or after forming the PMD liner film such as a TEOS film, the thin FSG film is further formed between the gate electrode and the liner film. Thus, materials included in the interlayer insulating film may be prevented from moving to the trap site formed in the gate oxide film and also leakage current of the high voltage semiconductor device such as an NMOS transistor may be reduced. Therefore, there is an effect of maximizing the device characteristics.

Generally, a low level of leakage current of the device is measured when fluorine has a high density in the chamber. In accordance with embodiments, fluorine is sufficiently supplied through the FSG film before or after the liner film is formed. Accordingly, the characteristics of oxide included in the liner film are maximized than when fluorine has a low density. Thus, it is possible to effectively prevent materials such as hydrogen and boron included in the interlayer insulating film from infiltrating into the trap site in the gate oxide film.

DRAWINGS

Example FIG. 1 illustrates a high voltage semiconductor device.

Figure 2A:
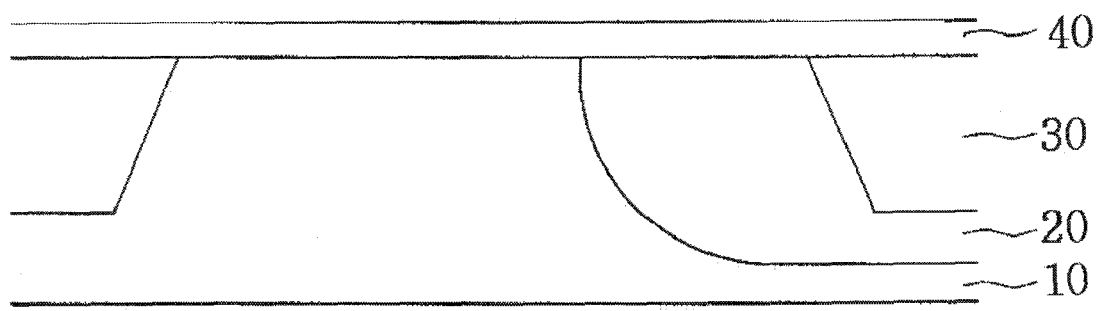
Figure 2B:
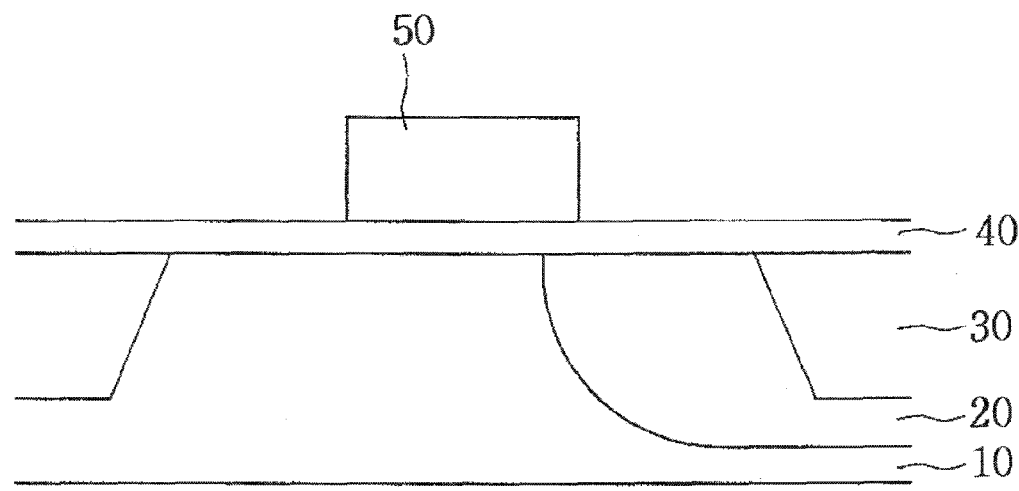
Figure 2C:
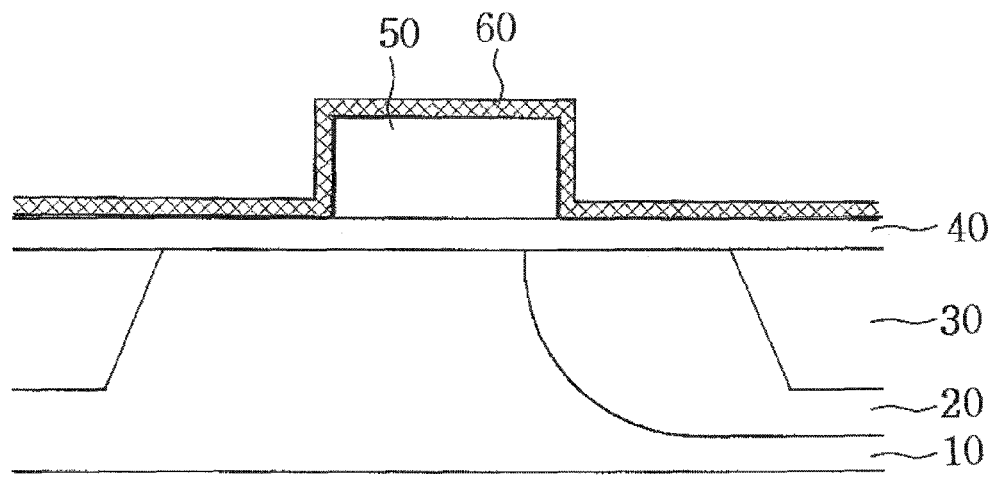
Figure 2D:
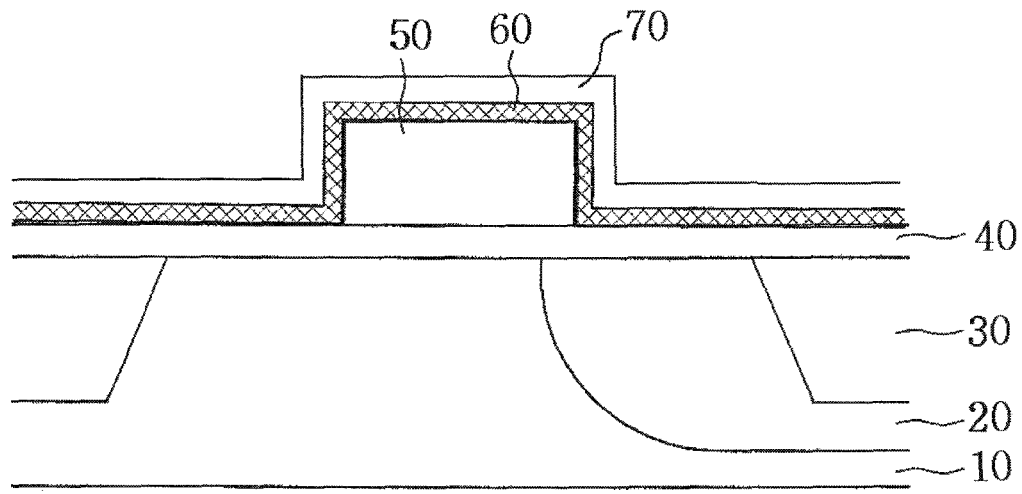
Figure 3:
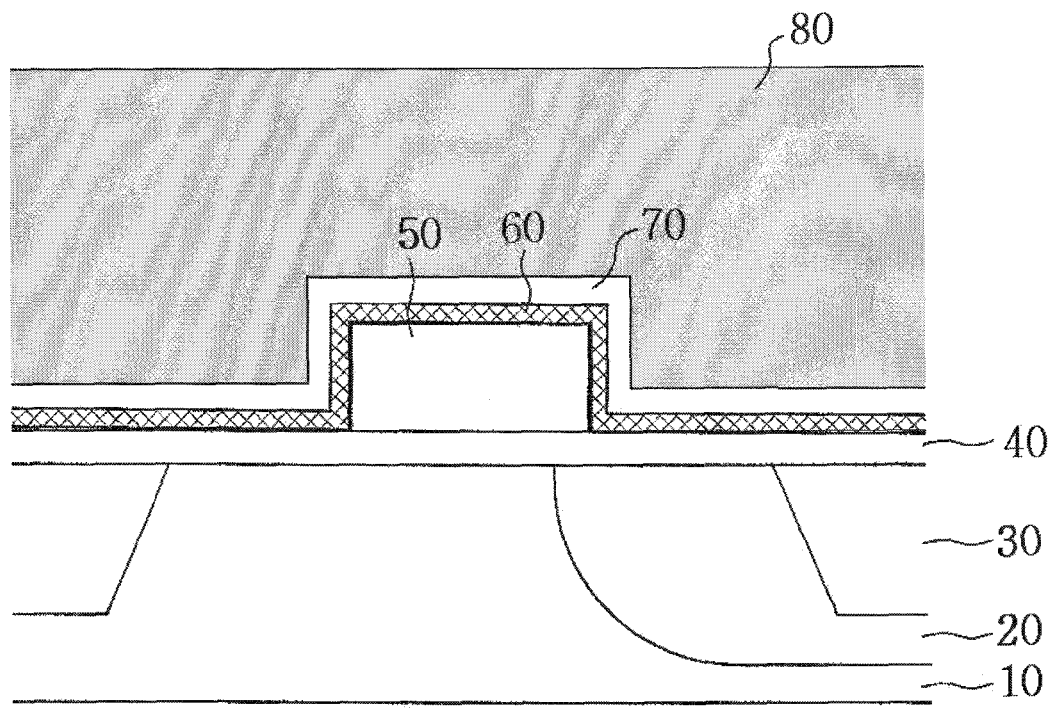

Example FIGS. 2 to 3 illustrate a high voltage semiconductor device and a method for manufacturing a high voltage semiconductor device in accordance with embodiments.

DESCRIPTION

Reference will now be made in detail to embodiments, examples of which are illustrated in the accompanying drawings. Wherever possible, the same reference numbers will be used throughout the drawings to refer to the same or like parts.

The configuration and the effect of embodiments are described with reference to the accompanying drawings. The configuration and the effect of embodiments illustrated in the drawings and described in embodiments are explained as at least one example, and the technical idea, essential configuration and effect of embodiments are not limited thereto.

The semiconductor device in accordance with embodiments may be an NMOS transistor such as a high voltage NMOS transistor.

As illustrated in example FIG. 2A, a method for manufacturing a high voltage semiconductor device in accordance with embodiments includes forming device isolation film 30 for defining a device isolation region in semiconductor substrate 10 having a high voltage device region and a low voltage device region. In order to form device isolation film 30, a trench is formed in the device isolation region of semiconductor substrate 10 and then an insulating film is filled in the trench. High voltage gate oxide film 40 is then deposited on and/or over semiconductor substrate 10 in the high voltage device region. A low voltage gate oxide film is also formed on and/or over semiconductor substrate 10 in the low voltage device region. After high voltage gate oxide film 40 is formed, a photoresist pattern is formed at a portion of the entire surface of substrate 10. An ion implantation process is then performed on semiconductor substrate 10 using the photoresist pattern as a mask to form well region 20 in semiconductor substrate 10. The photoresist pattern is then removed. A trap site is simultaneously formed in high voltage gate oxide film 40 during the ion implantation process. Specifically, the trap site may be formed in region(s) of high voltage gate oxide film 40 exposed by the photoresist pattern.

As illustrated in example FIG. 2B, a conductive material such as polysilicon is then deposited on and/or over high voltage gate oxide film 40 and then patterned to form gate electrode 50 on and/or over high voltage gate oxide film 40. Spacers having a predetermined thickness may be formed at opposite sidewalls of gate electrode 50. FSG film 60 and liner film 70 are then sequentially formed on and/or over the entire surface of semiconductor substrate 10 including gate electrode 50.

Example FIGS. 2C and 2D illustrate the manner in which FSG film 60 and liner film 70 are formed. As illustrated in example FIG. 2C, FSG film 60 is formed on and/or over the entire surface of semiconductor substrate 10 including gate electrode 50. Then, as illustrated in example FIG. 2D, liner film 70 is deposited on and/or over FSG film 60. Liner film 70 is an oxide film such as one of a preferential metal deposition (PMD) film, a middle temperature oxide (MTO) film, a high temperature oxide (HTO) film and a tetra ethyl ortho silicate (TEOS) film. Liner film 70 serves to isolate gate electrode 50 from metal lines to be formed subsequently. Alternatively, liner film 70 may be formed prior to forming FSG film 60. In which case FSG film 60 may be formed by ion implantation. Specifically, liner film 70 having a predetermined thickness is formed on and/or over the entire surface of semiconductor substrate 10 including gate electrode 50. Fluorine ions may then be implanted into the entire surface of semiconductor substrate 10 to form a thin FSG film 60 having a thickness of several ten to several hundred A in liner film 70.

As illustrated in example FIG. 3, after FSG film 60 and liner film 70 are formed, interlayer insulating film 80 is formed on and/or over the entire surface of semiconductor substrate 10 including one of FSG film 60 and liner film 70. Interlayer insulating film 80 may be any one of a borophosphosilicate glass (BPSG) film, a phosphosilicate (PSG) film and an undoped silicate glass (USG) film. For instance, after liner film 70 is formed on and/or over FSG film 60, an annealing process may be performed on and/or over the entire surface of semiconductor substrate 10 to form an annealed liner film 70 before interlayer insulating film 80 is formed. The annealing process is performed under one of nitrogen ($N_2$) or hydrogen ($H_2$) atmosphere at a temperature in a range between approximately 600 to 1000° C. Annealed liner film 70 and FSG film 60 combine to effectively prevent materials such as hydrogen and boron included in interlayer insulating film 80 from infiltrating into the trap site of gate oxide film 40. Annealed liner film 70 also prevents movement of materials between adjacent films more effectively than a non-annealed liner film 70.

Accordingly, as illustrated in example FIG. 3, the semiconductor device in accordance with embodiments includes semiconductor substrate 10 having a high voltage device region and a low voltage device region, well region 20, device isolation film 30, gate oxide film 40, gate electrode 50, fluorinated silicate glass (FSG) film 60, liner film 70 (annealed or non-annealed) and interlayer insulating film 80.

Device isolation film 30 is formed to define a device isolation region in semiconductor substrate 10. A gate oxide film is deposited on and/or over semiconductor substrate 10 in the high voltage device region to thereby form high voltage (HV) gate oxide film 40. After HV gate oxide film 40 is formed, well region 20 is formed in substrate 10 by implanting one of P-type or N-type dopants in substrate 10. Gate electrode 50 is formed in the active region of semiconductor substrate 10 including on and/or over gate oxide film 40. Spacers having a predetermined thickness may be formed at opposite sidewalls of gate electrode 50. FSG film 60 is formed on and/or over the entire surface of semiconductor substrate 10 including gate electrode 50 to thereby cover gate electrode 50. Liner film 70 is formed on and/or over the entire surface of semiconductor substrate 10 including FSG film 60 to thereby cover FSG film 60.

In accordance with embodiments, FSG film 60 and liner film 70 may be sequentially formed. For example, after a thin FSG film 60 is deposited having a thickness in a range between approximately several ten to several hundred Å, liner film 70 may then be deposited thereon and/or thereover. Alternatively, liner film 70 may be formed before forming FSG film 60. For example, after liner film 70 is formed thickly enough to cover gate electrode 50, fluorine ions may be implanted to form the thin FSG film 60 having a thickness in a range between approximately several ten to several hundred Å in liner film 70. Interlayer insulating film 80 is then formed on and/or over liner film 70.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a high voltage semiconductor device comprising:
    forming a gate oxide film over a semiconductor substrate in a high voltage device region thereof; and then
    forming a gate electrode over the semiconductor substrate including the gate oxide film; and then
    sequentially forming a fluorinated silicate glass (FSG) film and a liner film over the semiconductor substrate including the gate electrode; and then
    forming an interlayer insulating film over one of the FSG film and the liner film.

2. The method of claim 1, further comprising, after forming the gate oxide film and before forming the gate electrode: forming a well region in the semiconductor substrate.

3. The method of claim 2, wherein forming the well region comprises implanting one of P-type dopants and N-type dopants in the semiconductor substrate.

4. The method of claim 1, further comprising, after forming the liner film and before forming the interlayer insulating film: performing an annealing process on the liner film.

5. The method of claim 4, wherein the annealing process is performed under one of a nitrogen ($N_2$) atmosphere and a hydrogen ($H_2$) atmosphere.

6. The method of claim 1, wherein the liner film comprises one of a preferential metal deposition (PMD) film, a middle temperature oxide (MTO) film and a high temperature oxide (HTO) film.

7. The method of claim 1, wherein the interlayer insulating film comprises one of a borophosphosilicate glass (BPSG) film, a phosphosilicate (PSG) film and an undoped silicate glass (USG) film.

8. The method of claim 1, wherein sequentially forming the FSG film and the liner film comprises:
    forming the FSG film over the entire surface of the semiconductor substrate including the gate electrode; and then
    forming the liner film over the FSG film; and then
    performing an annealing process on the liner film.

9. The method of claim 1, wherein sequentially forming the FSG film and the liner film comprises:
    forming the liner film over the entire surface of the semiconductor substrate including the gate electrode; and then
    forming the FSG film in the upper surface of the liner film by performing an ion implantation process.

10. The method of claim 9, wherein forming the FSG film comprises implanting fluorine ions into the upper surface of the liner film.

11. The method of claim 1, wherein the liner film is formed over the entire surface of the semiconductor substrate to cover the FSG film.

* * * * *